(12) United States Patent  (10) Patent No.: US 7,579,756 B2
Althoff et al.  (45) Date of Patent: Aug. 25, 2009

(54) PIEZOACTUATOR WITH LOW STRAY CAPACITANCE

(75) Inventors: Anke Althoff, St.-Andrä-Wördem (AT); Adalbert Feltz, Deutschlandsberg (AT); Heinz Florian, Bad Gams (AT)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 11/813,904

(22) PCT Filed: Jan. 18, 2006

(86) PCT No.: PCT/DE2006/000067

§ 371 (c)(1),
(2), (4) Date: Aug. 24, 2007

(87) PCT Pub. No.: WO2006/076894

PCT Pub. Date: Jul. 27, 2006

(65) Prior Publication Data

US 2008/0042522 A1 Feb. 21, 2008

(30) Foreign Application Priority Data

Jan. 18, 2005 (DE) ............... 10 2005 002 428
Apr. 22, 2005 (DE) ............... 10 2005 018 791

(51) Int. Cl.
*H01L 41/083* (2006.01)
(52) U.S. Cl. ................................................. 310/328
(58) Field of Classification Search ........... 310/328, 310/366
See application file for complete search history.

(56) References Cited

U.S. PATENT DOCUMENTS 3,835,340 A * 9/1974 Schildkraut ............ 310/334
5,828,160 A * 10/1998 Sugishita ............... 310/366
6,111,343 A * 8/2000 Unami et al. ........... 310/366
6,495,946 B1 12/2002 Heinz et al.
7,358,653 B2 * 4/2008 Nishimura .............. 310/340
2001/0040420 A1 * 11/2001 Watanabe et al. ....... 310/311
2002/0084872 A1 7/2002 Kawazoe
2002/0109435 A1 * 8/2002 Cotton, III ............. 310/328
2006/0238073 A1 10/2006 Ragossnig et al.
2007/0046148 A1 * 3/2007 Sugg ..................... 310/328

FOREIGN PATENT DOCUMENTS

| DE | 42 01 937 | 7/1992 |
| DE | 199 28 176 | 1/2001 |
| DE | 101 63 005 | 10/2002 |
| DE | 103 07 825 | 9/2004 |
| DE | 103 21 694 | 12/2004 |

(Continued)

OTHER PUBLICATIONS

International Search Report for PCT/DE2006/000067.

(Continued)

*Primary Examiner*—Thomas M Dougherty
(74) *Attorney, Agent, or Firm*—Fish & Richardson P.C.

(57) ABSTRACT

A piezoelectric actuator includes a stack of piezoceramic layers and electrodes among the piezoceramic layers. At least one edge region of the stack does not include electrodes. A cover layer is at the at least one edge region. The cover layer has a dielectric constant that is less than a dielectric constant of a piezoceramic layer.

20 Claims, 1 Drawing Sheet

FOREIGN PATENT DOCUMENTS

| | | | |
|---|---|---|---|
| DE | 10353171 | * | 6/2005 |
| JP | 63-288075 | | 11/1988 |
| JP | 03-097310 | * | 4/1991 |
| JP | 07-154005 | | 6/1995 |
| JP | 2002-305792 | * | 10/2002 |
| WO | WO03/026033 | | 3/2003 |
| WO | WO2005/053046 | | 6/2005 |
| WO | WO2005/069394 | | 7/2005 |

OTHER PUBLICATIONS

Written Opinion for PCT/DE2006/000067.
English translation of Written Opinion for PCT/DE2006/000067.

* cited by examiner

PIEZOACTUATOR WITH LOW STRAY CAPACITANCE

TECHNICAL FIELD

This patent application is directed to a piezoelectric actuator. Such an actuator can be used, for example, to control valves of a motor vehicle.

BACKGROUND

DE 103 07 825 A1 describes a piezoelectric actuator with internal electrodes.

SUMMARY

Described herein is a piezoelectric actuator with low stray capacitance.

According to at least one embodiment of the piezoelectric actuator described here, a plurality of piezoceramic layers stacked one on top of the other form a body. Internal electrodes are arranged among the piezoceramic layers. Two types of internal electrodes can be used.

A first type of internal electrode is connected to a first pole of a voltage source. A second type of internal electrode is connected to a second pole of a voltage source. The internal electrodes are arranged so that they form capacitors connected in parallel. In this way, when a voltage is applied, the resulting electrical energy can be converted into mechanical energy due to the inverse piezoelectric effect.

In addition, the body has at least one edge region, which is free from internal electrodes. Each edge region can border directly on an end side of the stack.

There may be two edge regions, one for each end side of the stack. In one edge region of the piezoelectric actuator, there may be one cover layer, which has a low dielectric constant. The dielectric constant may be less than 100, e.g., less than 20.

According to at least one embodiment, the dielectric constant of one cover layer in an edge region is less than the dielectric constant of the piezoceramic layers. It is not necessary that all of the piezoceramic layers be equal, but the dielectric constant of the cover layer may be less than the dielectric constant of the adjacent piezoceramic layer.

The stray capacitance of the piezoelectric actuator is influenced by, among other things, the dielectric constant of the material in the edge region of the body.

Therefore, with the help of a cover layer, a piezoelectric actuator with relatively low stray capacitance can be obtained. This is because the capacitive coupling of the piezoelectric actuator with its surroundings is also dictated, among other things, by the layers or their dielectric constants on the top side or on the bottom side of the stack. The greater the dielectric constant is in this region, the greater the capacitive coupling is at the edge of the capacitor. A cover layer in the edge region of the body with a very low dielectric constant can reduce the stray capacitance.

In one embodiment of the piezoelectric actuator, the cover layer contains a ceramic material, such as aluminum oxide.

According to at least one embodiment of the piezoelectric actuator, the cover layer is sintered with a bordering piezoceramic layer or also with a bordering ceramic layer, which does not necessarily have to exhibit the piezoelectric effect. As a result, a close connection between the cover layer and the rest of the piezoelectric actuator can be produced.

In addition, the production can be performed quickly and simply, because common sintering of piezoceramic layers with internal electrodes and the common sintering of piezoelectric layers together with one or more cover layers leads to a monolithic component, which has good electromechanical properties and also increased mechanical stability.

According to another embodiment of the piezoelectric actuator, a cover layer is adhered with a bordering layer. The cover layer can be adhered onto the top side or onto the bottom side of the body.

According to another embodiment of the piezoelectric actuator, the body or the stack of layers lying one above the other, and optionally sintered together, includes a means for generating a biasing stress. Such a means can generate, for example, a compressive stress as a biasing stress for the piezoelectric actuator. Then, when the piezoelectric actuator expands, work must be exerted against the biasing stress. When the external electrical voltage is removed, the actuator returns automatically into its unexpanded, that is, shortened, ground state at least partially due to the biasing stress.

Suitable means for generating a mechanical biasing stress can be, for example, a tube spring.

Means for generating a biasing stress can contact one or more end faces of the body. This produces, in turn, a coupling of the ends of the body with the surroundings, which is why the cover layers is used for the electrical coupling.

Below, a piezoelectric actuator is described in more detail with reference to embodiments and the associated figures:

DESCRIPTION OF THE DRAWINGS

Elements of the piezoelectric actuator that are identical or that have an identical function are designated by the same reference symbols. The representations are not to scale, but instead are either reduced or enlarged for better clarity and are also distorted, if necessary, in their proportions.

DETAILED DESCRIPTION

Figure 1:
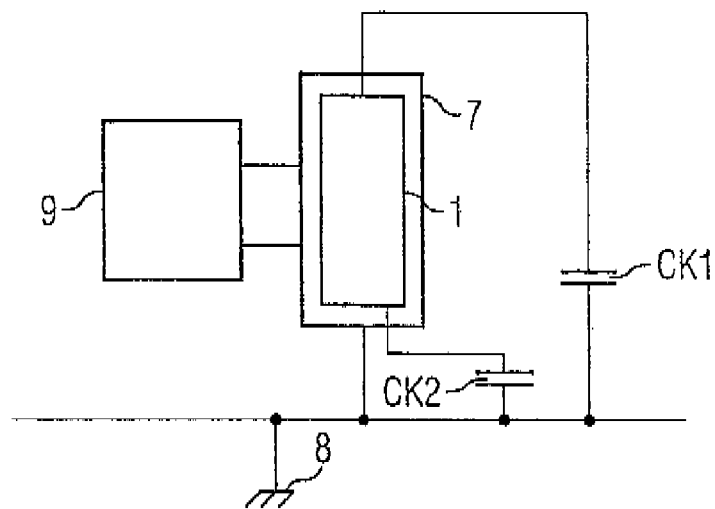
FIG. 1 shows the installation situation of a piezoelectric actuator in a motor vehicle.

FIG. 1 shows a piezoelectric actuator with a stack 1 of layers lying one above the other. The piezoelectric actuator is connected to an electrical circuit 9, which is used for driving the piezoelectric actuator. A tube spring 7 is provided for generating a mechanical biasing stress for the piezoelectric actuator. Based on the shown installation, there is an electrical coupling of the piezoelectric actuator, especially the two ends of the stack 1, to the ground 8 of the motor vehicle. The capacitive coupling to ground is represented by the two coupling capacitors CK1 and CK2. When the actuator is operating, especially when the actuator is mechanically loaded, uncontrollable charges can be produced, which flow via the coupling capacitors CK1 and CK2 to the vehicle ground.

Among other things, through the use of cover layers with a low dielectric constant, the problem of stray capacitance can be reduced.

Through the use of cover layers, which have a low dielectric constant, a reduced value results for the stray capacitance, which represent the coupling capacitors CK1 and CK2. In particular, a higher electrical resistance can be achieved for a changing load.

Figure 2:
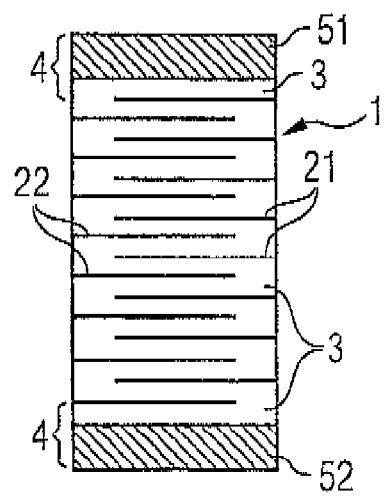
FIG. 2 shows, as an example, a piezoelectric actuator in a schematic longitudinal section.
Figure 3:
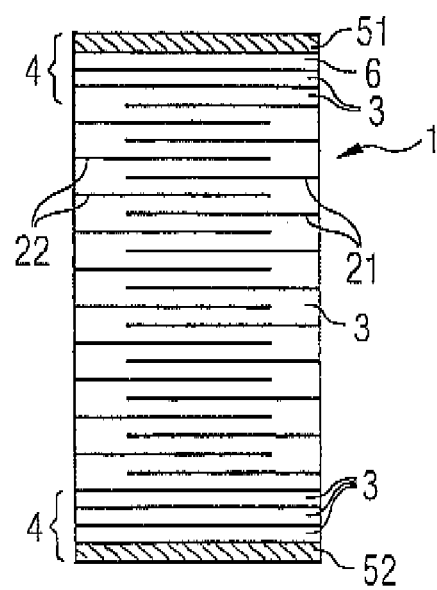
FIG. 3 shows another example piezoelectric actuator in a schematic longitudinal section.

In a longitudinal section, FIGS. 2 and 3 show a piezoelectric actuator with piezoceramic layers 3 stacked one above the other. The piezoceramic layers 3 form a stack 1 or a body. In addition, the stack 1 still contains edge regions 4, one each on the top side and on the bottom side. The edge regions 4 are free from internal electrodes and thus do not contribute to the active part of the layer package. At the top and bottom edge of the active package there is another additional piezoceramic layer 3. Within the active package, internal electrodes 21 of a first type and internal electrodes 22 of a second type are arranged, which intermesh with each other and form structures arranged like a multiple-layer capacitor. External contacts to the internal electrodes 21, 22 are not shown in the figures, but can be implemented via suitable means. The piezoceramic layers 3 are stacked one above the other, provided with internal electrodes, and then compressed and sintered.

According to FIG. 2, a cover layer 51, 52 is arranged in edge regions 4 on the top side and on the bottom side of the stack 1. This cover layer is formed from a suitable ceramic material, which allows common sintering with the other piezoceramic layers 3.

For example, in one embodiment according to FIG. 2, a material with the composition $Ba_{6-x}(Sa_yNd_{1-y})_{8+2x/3}Ti_{18}O_{54}$ can be provided as the material for the cover layer. Here, the adaptation of the sintering temperature and the contraction behavior for common sintering with the piezoceramic is achieved through a suitable addition of a glass frit, such as a zinc borosilicate glass. For the parameters of the cover-layer ceramic material composition, the following parameter values are used for x and y:

$x=1.5; y=0.9$ $x=2; y=0.7.$

Such a composition is suited for common sintering with a piezoceramic. The dielectric constant of the specified material for such a cover layer is approximately 80.

The specified formulation is suited for piezoelectric actuators, for which the internal electrodes are composed of or contain copper. In this case, the following material is used as the piezoceramic, for example: $Pb_{0.97}Nd_{0.02}V_{0.01}(Zr_{0.53}Ti_{0.47})O_3$. Here, V stands for a vacancy. The common sintering is performed, for example, at 1000° C., so that copper electrodes are not damaged.

In another embodiment according to FIG. 2, the internal electrodes are formed from an alloy of silver and palladium. In this case, sintering can be performed at somewhat higher temperatures. Accordingly, a composition that reads as follows is used as the ceramic material for the cover layer as an example:

$(Ba_{3.603}Pb_{0.205}Bi_{1.371}Nd_{7.681}Pr_{0.189})(Ti_{17.885}Nb_{0.115}O_{54}).$

This composition is provided with a portion of glass frit for the purpose of adapting the contraction and adapting the sintering temperature to the piezoceramic. One feature of the ceramic used in this embodiment is to fill the vacancies designated as V by absorbing silver from the silver-palladium internal electrodes during the sintering, so that the composition is then $Pb_{0.79}Nd_{0.02}Ag_{0.02}(Zr_{0.53}Ti_{0.47})O_3$. A somewhat varied composition (V is replaced with Ag) is used in this case for the piezoceramic layers.

The dielectric constant of the material of the cover layer is approximately 90. In comparison, the dielectric constant for the piezoceramic is has a value of around 3000 to 3500. The dielectric constant of the cover layer is thus less by at least a factor of 10, optionally even by a factor of 100 than the dielectric constant of the piezoelectric layers.

This also applies for an embodiment according to FIG. 3. There, after producing the active package for forming the piezoelectric actuator on the uppermost piezoceramic layer 3, a cover layer 51, which can contain, for example, aluminum oxide, is applied via an adhesive layer 6 and/or, in a similar way, the lowermost piezoceramic layer is also provided with an analog fixed cover layer. The mentioned materials have a dielectric constant of approximately 10 and are thus less by approximately a factor of 300 than the dielectric constant of the piezoceramic.

The cover layers 51, 52 in FIG. 3 can be composed, for example, from a sintered aluminum oxide ceramic and can be provided as a sintered wafer.

The invention claimed is:

1. A piezoelectric actuator comprising:
   a stack of piezoceramic layers;
   electrodes among the piezoceramic layers;
   wherein at least one edge region of the stack does not include electrodes; and
   a cover layer at the at least one edge region, the cover layer having a dielectric constant that is less than a dielectric constant of a piezoceramic layer.

2. The piezoelectric actuator of claim 1, wherein the cover layer comprises a ceramic material.

3. The piezoelectric actuator of claim 1, wherein the cover layer is sintered with a piezoceramic layer that borders the cover layer.

4. The piezoelectric actuator of claim 1, wherein the cover layer adheres to a piezoceramic layer that borders the cover layer.

5. The piezoelectric actuator of claim 1, further comprising:
   a tube spring for generating a mechanical biasing stress for the piezoelectric actuator, the tube spring having an electrical connection to ground;
   wherein stray capacitance caused at least in part by the electrical connection of the tube spring to ground is reduced by the cover layer.

6. The piezoelectric actuator of claim 1, further comprising:
   a device for generating a mechanical biasing stress, the device contacting the at least one edge region.

7. The piezoelectric actuator of claim 1, wherein the cover layer comprises $Ba_{6-x}(Sa_yNd_{1-y})_{8+2x/3}Ti_{18}O_{54}$, where x is 1.5 and y is 0.9.

8. The piezoelectric actuator of claim 1, wherein the cover layer comprises $Ba_{6-x}(Sa_yNd_{1-y})_{8+2x/3}Ti_{18}O_{54}$, where x is 2 and y is 0.7.

9. The piezoelectric actuator of claim 1, wherein at least one of the piezoceramic layers comprises $Pb_{0.97}Nd_{0.02}V_{0.01}(Zr_{0.53}Ti_{0.47})O_3$, where V is a vacancy.

10. The piezoelectric actuator of claim 1, wherein the cover layer comprises $(Ba_{3.603}Pb_{0.205}Bi_{1.371}Nd_{7.681}Pr_{0.189})(Ti_{17.885}Nb_{0.115}O_{54})$.

11. The piezoelectric actuator of claim 1, wherein at least one of the piezoceramic layers comprises $Pb_{0.79}Nd_{0.02}Ag_{0.02}(Zr_{0.53}Ti_{0.47})O_3$.

12. The piezoelectric actuator of claim 1, wherein the dielectric constant of the cover layer is less than $1/10^{th}$ of the dielectric constant of the piezoceramic layer.

13. The piezoelectric actuator of claim 1, wherein the dielectric constant of the cover layer is between $1/10^{th}$ and $1/100^{th}$ of the dielectric constant of the piezoceramic layer.

14. The piezoelectric actuator of claim 1, wherein the at least one edge region comprises a first edge region adjacent to a top of the stack and a second edge region adjacent to a bottom of the stack;

wherein the cover layer is for the first edge region; and
wherein the piezoelectric actuator further comprises a second cover layer for the second edge region.

15. The piezoelectric actuator of claim 1, wherein internal electrodes in the stack comprise first internal electrodes electrically connected to a first pole of a voltage source and second internal electrodes electrically connected to a second pole of the voltage source.

16. A piezoelectric actuator comprising:
   piezoceramic layers;
   electrodes among the piezoceramic layers, the piezoceramic layers and the electrodes forming a base body;
   a first cover layer at a first end of the base body; and
   a second cover layer at a second end of the base body;
   wherein dielectric constants of the first cover layer and the second cover layer are less than dielectric constants of the piezoceramic layers.

17. The piezoelectric actuator of claim 16, wherein the first end of the base body and the second end of the base body do not include electrodes.

18. The piezoelectric actuator of claim 16, wherein the dielectric constants of the first and second cover layers are less than $1/10^{th}$ of the dielectric constants of the piezoceramic layers.

19. The piezoelectric actuator of claim 16, further comprising:
   a tube spring for generating mechanical biasing stress for the piezoelectric actuator.

20. The piezoelectric actuator of claim 16, wherein the first and second cover layers comprise sintered aluminum oxide ceramic.

* * * * *